(12) United States Patent
Hiraoka

(10) Patent No.: US 9,434,847 B2
(45) Date of Patent: Sep. 6, 2016

(54) PHOTOPOLYMERIZABLE COMPOSITION, PHOTOPOLYMERIZABLE INK JET INK, AND INK CARTRIDGE

(71) Applicant: Takao Hiraoka, Kanagawa (JP)

(72) Inventor: Takao Hiraoka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 205 days.

(21) Appl. No.: 14/225,696

(22) Filed: Mar. 26, 2014

(65) Prior Publication Data

US 2014/0311380 A1  Oct. 23, 2014

(30) Foreign Application Priority Data

Apr. 23, 2013 (JP) .................................. 2013-090043
Feb. 26, 2014 (JP) .................................. 2014-035131

(51) Int. Cl.
| | | |
|---|---|---|
| C09D 11/10 | (2014.01) | |
| C09D 11/30 | (2014.01) | |
| G03F 7/033 | (2006.01) | |
| C09D 11/101 | (2014.01) | |

(52) U.S. Cl.
CPC ............. *C09D 11/101* (2013.01); *C09D 11/30* (2013.01); *G03F 7/033* (2013.01)

(58) Field of Classification Search
CPC ...... C09D 11/101; C09D 11/30; G03F 7/033
See application file for complete search history.

(56) References Cited

U.S. PATENT DOCUMENTS

| | | |
|---|---|---|
| 2008/0103254 A1 | 5/2008 | Asada |
| 2012/0086762 A1 | 4/2012 | Noguchi et al. |
| 2012/0147103 A1 | 6/2012 | Hasegawa et al. |
| 2012/0176456 A1 | 7/2012 | Maekawa et al. |
| 2012/0200648 A1 | 8/2012 | Hiraoka et al. |
| 2012/0242768 A1 | 9/2012 | Seno et al. |
| 2012/0293589 A1 | 11/2012 | Hiraoka |
| 2013/0065024 A1 | 3/2013 | Aruga et al. |
| 2013/0321539 A1 | 12/2013 | Hiraoka |
| 2014/0125744 A1 | 5/2014 | Hiraoka |

FOREIGN PATENT DOCUMENTS

| | | |
|---|---|---|
| EP | 1 942 159 A1 | 7/2008 |
| JP | 2012-140593 | 7/2012 |
| JP | 2013-181114 | 9/2013 |
| JP | 2013-256659 | 12/2013 |
| WO | WO 2009/051200 A1 | 4/2009 |
| WO | WO 2012/153867 A1 | 11/2012 |

OTHER PUBLICATIONS

The Extended European Search Report issued Jul. 16, 2014, in Application No./ U.S. Pat. No. 14165433.5-1564.
U.S. Appl. No. 14/083,651, filed Nov. 19, 2013.
U.S. Appl. No. 14/082,381, filed Nov. 18, 2013.
U.S. Appl. No. 14/118,405, filed Nov. 18, 2013.
U.S. Appl. No. 14/349,027, filed Apr. 1, 2014 Inventor: Hiraoka.

*Primary Examiner* — Sanza McClendon
(74) *Attorney, Agent, or Firm* — Oblon, McClelland, Maier & Neustadt, L.L.P.

(57) ABSTRACT

A photopolymerizable composition includes diethyleneglycoldimethacrylate and alkoxy-modified (meth)acrylic acid ester having an n not less than 9. The n is an average polymerization degree of an alkoxy part of the (meth)acrylic acid ester.

9 Claims, 1 Drawing Sheet

PHOTOPOLYMERIZABLE COMPOSITION, PHOTOPOLYMERIZABLE INK JET INK, AND INK CARTRIDGE

CROSS-REFERENCE TO RELATED APPLICATIONS

This patent application is based on and claims priority pursuant to 35 U.S.C. §119 to Japanese Patent Applications Nos. 2013-090043 and 2014-035131, filed on Apr. 23, 2013 and Feb. 26, 2014, respectively in the Japan Patent Office, the entire disclosure of which is hereby incorporated by reference herein.

BACKGROUND

1. Technical Field

The present invention relates to a photopolymerizable composition, and a photopolymerizable inkjet ink and an ink cartridge containing the ink.

2. Description of the Related Art

PCT Japanese published national phase application No. 2004-526820 discloses a photopolymerizable composition and a photopolymerizable inkjet ink using (meth)acrylic acid ester.

The present inventors have found some (meth)acrylic acid esters and (meth)acryl amides having no problem of skin sensitization. As disclosed in Japanese published unexamined application No. JP-2012-140593-A, they noticed that methacrylate is less toxic than acrylate and suggested an inkjet ink mainly using methacrylate.

Further, Japanese published unexamined applications Nos. JP-2013-181114-A and JP-2013-256659-A disclose a coating film having sufficient durability for the purpose of protecting surface. However, besides the sufficient durability, it is required that appearance is not changed even when exposed to direct sunlight.

When a solid coating film is formed without printing a specific design, spray coating or brush coating can be used instead of inkjet printing. However, it is difficult to form a coating film having high strength and good light resistance without a skin problem of skin sensitization.

The present inventors disclose in Japanese patent application No. 2012-215753 a coating film having low viscosity and high strength without a skin problem of skin sensitization.

Because of these reasons, a need exists for a photopolymerizable composition capable of forming a coating film having low viscosity, high strength and processing suitability without a skin problem of skin sensitization.

SUMMARY

Accordingly, one object of the present invention is to provide a photopolymerizable composition capable of forming a coating film having low viscosity, high strength and processing suitability without a skin problem of skin sensitization.

Another object of the present invention is to provide an inkjet ink using the photopolymerizable composition.

A further object of the present invention is to provide an ink cartridge containing the inkjet ink.

These objects and other objects of the present invention, either individually or collectively, have been satisfied by the discovery of a photopolymerizable composition including diethyleneglycoldimethacrylate and alkoxy-modified (meth)acrylic acid ester having an n not less than 9, wherein the n is an average polymerization degree of an alkoxy part of the (meth)acrylic acid ester.

These and other objects, features and advantages of the present invention will become apparent upon consideration of the following description of the preferred embodiments of the present invention taken in conjunction with the accompanying drawings.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION

Figure 1:
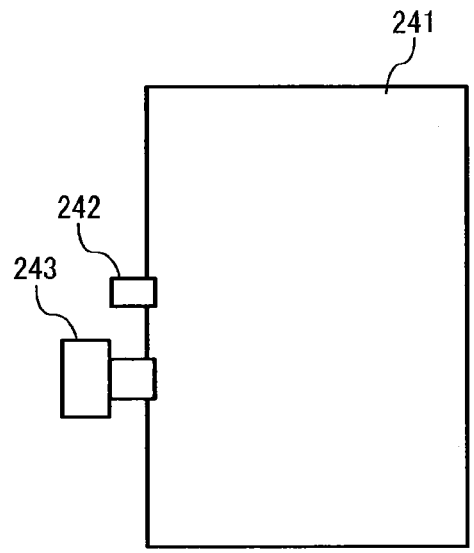
FIG. 1 is a schematic view illustrating an example of an ink bag of the ink cartridge of the present invention.

The present invention provides a photopolymerizable composition capable of forming a coating film having low viscosity, high strength and processing suitability without a skin problem of skin sensitization.

More particularly, the present invention relates to a photopolymerizable composition including diethyleneglycoldimethacrylate and alkoxy-modified (meth)acrylic acid ester having an n not less than 9, wherein the n is an average polymerization degree of an alkoxy part of the (meth)acrylic acid ester.

Further including caprolactone-modified dipentaerythritol hexaacrylate and/or ethyleneoxide-modified trimethylolpropanetrimethacrylate, the photopolymerizable composition improves in strength of the coating film.

The photopolymerizable composition negative for skin sensitization refers to a compound satisfying at least the following (1) or (2):

(1) a compound having a Stimulation Index (SI value) of less than 3, where the Stimulation Index indicates the level of sensitization as measured by a skin sensitization test based on the LLNA (Local Lymph Node Assay); and (2) a compound evaluated as "negative for skin sensitization" or "no skin sensitization" in its MSDS (Material Safety Data Sheet).

Regarding the above (1), the compound having the SI value of less than 3 is considered as negative for skin sensitization as described in literatures, for example, "Functional Material" (Kino Zairyou) 2005, September, Vol. 25, No. 9, p. 55. The lower SI value means the lower level of skin sensitization. Thus, in the present invention, a monomer having the lower SI value is preferably used. The SI value of the monomer used is preferably less than 3, more preferably 2 or lower, and even more preferably 1.6 or lower.

Diethyleneglycoldimethacrylate is suitably used as a material of the photopolymerizable composition usable as an inkjet ink because of having no problem of skin sensitization and low viscosity.

The coating film is hard enough to protect the surface, but is cracked or chipped when receiving an outer force such as punching and cutting because of lacking in flexibility.

However, the alkoxy-modified (meth)acrylic acid ester having an n not less than 9 prevents the coating film from being cracked and chipped when processed.

The photopolymerizable composition preferably includes the diethyleneglycoldimethacrylate in an amount of from 10 to 95 parts by weight, and more preferably from 25 to 85 parts by weight per 100 parts by weight of monomeric components.

Specific examples of the alkoxy-modified (meth)acrylic acid ester having an n not less than 9 include, but are not limited to, ethyleneoxide-modified bisphenol A diacrylate (n=10), polypropylene glycol diacrylate (n=12), ethyleneoxide-modified pentaerythritol tetraacrylate (n=35), polypropylene glycol dimethacrylate (n=9) and polypropylene glycol dimethacrylate (n=14).

A suitable amount of the alkoxy-modified (meth)acrylic acid ester having an n not less than 9 prevents the coating film from being cracked and chipped when processed without deterioration of strength of the coating film.

The alkoxy-modified (meth)acrylic acid ester preferably has an n not less than 9. Further, when the n is from 9 to 15, the photopolymerizable composition has low viscosity and can preferably be used as an inkjet ink.

Various ejection heads are marketed from many manufacturers, and some of them have large ejection power to eject an ink having high viscosity and wide thermostat.

The ink preferably has a viscosity of from 2 to 150 mPa·s, and more preferably from 5 to 18 mPa·s at 25° C. However, the thermostat of the ejection head can be used. When the viscosity is too high at 25° C., the head may be heated when necessary to make the ink have lower viscosity. When heated at from 45 to 60° C., the ink preferably has a viscosity of from 5 to 18 mPa·s thereat.

Therefore, the photopolymerizable composition preferably includes the alkoxy-modified (meth)acrylic acid ester having an n not less than 9 in an amount of from 5 to 70 parts by weight per 100 parts by weight of the (meth)acrylic acid ester monomer which is a monomeric component. The photopolymerizable composition preferably includes the alkoxy-modified methacrylic acid ester having an n not less than 9 in an amount of from 5 to 20 parts by weight per 100 parts by weight of the (meth)acrylic acid ester monomer. The photopolymerizable composition preferably includes the alkoxy-modified acrylic acid ester having an n not less than 9 in an amount of from 20 to 70 parts by weight per 100 parts by weight of the (meth)acrylic acid ester monomer.

The photopolymerizable composition of the present invention preferably includes caprolactone-modified dipentaerythritol hexaacrylate or ethyleneoxide-modified trimethylol propane trimethacrylate as a polymerizable monomer. The photopolymerizable composition preferably includes the caprolactone-modified dipentaerythritol hexaacrylate in an amount of from 3 to 15 parts by weight, and more preferably from 5 to 10 pasts by weight per 100 parts by weight of the (meth)acrylic acid ester monomer. The photopolymerizable composition preferably includes the ethyleneoxide-modified trimethylol propane trimethacrylate in an amount of from 15 to 60 parts by weight, and more preferably from 20 to 50 pasts by weight per 100 parts by weight of the (meth)acrylic acid ester monomer.

The following (meth)acrylates and (meth)acryl amides can be used together as long as a resulting ink does not have a problem, even through they have a problem of skin sensitization in some degrees when used alone, or skin sensitization thereof is not confirmed.

Specific examples thereof include, but are not limited to, ethylene glycol di(meth)acrylate, hydroxypivalic acid neopentyl glycol di(meth)acrylate, γ-butyrolactone acrylate, isobornyl(meth)acrylate, formulated trimethylol propane mono(meth)acrylate, polytetramethylene glycol di(meth) acrylate, trimethylol propane (meth)acrylic acid benzoate, diethylene glycol diacrylate, triethylene glycol diacrylate, tetraethylene glycol diacrylate, polyethylene glycol diacrylate [$CH_2$=CH—CO($OC_2H_4$)$_n$—OCOCH=$CH_2$(n≈9)], [$CH_2$=CH—CO($OC_2H_4$)$_n$—OCOCH=$CH_2$ (n≈14)], [$CH_2$=CH—CO($OC_2H_4$)$_n$—OCOCH=$CH_2$ (n≈23)], dipropylene glycol di(meth)acrylate, tripropylene glycol di(meth)acrylate, polypropylene glycol dimethacrylate [$CH_2$=C($CH_3$)—CO—($OC_3H_6$)$_n$—OCOC($CH_3$)=$CH_2$ (n≈7)], 1,3-butanediol diacrylate, 1,4-butanediol di(meth) acrylate, 1,6-hexanediol di(meth)acrylate, 1,9-nonanediol di(meth)acrylate, neopentyl glycol di(meth)acrylate, tricyclodecane dimethanol diacrylate, propylene oxide-modified bisphenol A di(meth)acrylate, polyethylene glycol di(meth) acrylate, dipentaerythritol hexa(meth)acrylate, (meth)acryloyl morpholine, 2-hydroxypropyl (meth)acryl amide, propylene oxide-modified tetramethylol methane tetra(meth) acrylate, dipentaerythritol hydroxypenta(meth)acrylate, caprolactone-modified dipentaerythritol hydroxypenta (meth)acrylate, ditrimethylol propane tetra(meth)acrylate, pentaerythritol tetra(meth)acrylate, trimethylol propane acrylate, ethylene oxide-modified trimethylol propane triacrylate, propylene oxide-modified trimethylol propane tri (meth)acrylate, caprolactone-modified trimethylol propane tri(meth)acrylate, pentaerythritol tri(meth)acrylate, tris(2-hydroxyethyl)isocyanurate tri(meth)acrylate, ethoxylated neopentyl glycol di(meth)acrylate, propylene oxide-modified neopentyl glycol di(meth)acrylate, propylene oxide-modified glyceryl tri(meth)acrylate, polyester di(meth)acrylate, polyester tri(meth)acrylate, polyester tetra(meth) acrylate, polyester penta(meth)acrylate, polyester poly (meth)acrylate, N-vinyl caprolactam, N-vinyl pyrrolidone, N-vinyl formamide, polyurethane di(meth)acrylate, polyurethane tri(meth)acrylate, polyurethane tetra(meth)acrylate, polyurethane penta(meth)acrylate and polyurethane poly(meth)acrylate, A photoradical polymerization initiator is preferably used for the photopolymerizable composition of the present invention. The (meth)acrylic acid ester and the (meth)acryl amide are known to have an ionic polymerizability as well. The ionic polymerization initiators are generally expensive and generate a slight amount of strong acid or strong alkali even in the state where they are not irradiated with light. Thus, it is necessary to take special cares such as imparting acid resistance and alkali resistance to an ink supply channel of an inkjet coating system, imposing limitation on the choice of members constituting the inkjet coating system.

In contrast, the ink of the present invention can use a photoradical polymerization initiator that is inexpensive and generates no strong acid or strong alkali. Thus, it is possible to produce an ink at low cost, and also it is easy to choose members of an inkjet coating system.

When using a quite high energy light source, such as electron beams, α rays, β rays, γ rays or X rays, polymerization reaction can proceed without polymerization initiator. Since this is a conventionally known matter, the equipment is very expensive and the maintenance is complicated, this not described in detail in the present invention.

The photoradical polymerization initiators include, but are not limited to, a self-cleaving photopolymerization initiator and a hydrogen-abstracting polymerization initiator. These may be used alone, or in combination.

Specific examples of the self-cleaving photopolymerization initiator include, but are not limited to, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy- 2-methylpropionyl)benzyl]phenyl}-2-methyl-1-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)butanone-1, 2-dimethylamino-2-(4-methylbenzyl)-1-(4-morpholin-4-yl-phenyl)butan-1-one, bis(2,4,6-trimethylbenzoyl)phenyl phosphine oxide, bis(2,6-dimethoxybenzoyl)-2,4,4-trimethyl-pentylphosphine oxide, 2,4,6-trimethylbenzoylphosphine oxide, 1,2-octanedion-[4-(phenylthio)-2-(o-benzoyloxime)], ethanone-1-[9-ethyl-6-(2-methylbenzoyl)-9H-carbazol-3-yl]-1-(O-acetyloxime) and [4-(methylphenylthio)phenyl]phenylmethanone.

Specific examples of the hydrogen-abstracting polymerization initiator include, but are not limited to, benzophenone compounds such as benzophenone, methylbenzophenone, methyl-2-benzoylbenzoate, 4-benzoyl-4'-methyldiphenyl sulfide and phenylbenzophenone; and thioxanthone compounds such as 2,4-diethylthioxanthone, 2-chlorothioxanthone, isopropylthioxanthone and 1-chloro-4-propylthioxanthone.

Amines can be used together as a polymerization accelerator.

Specific examples thereof include, but are not limited to, p-dimethylaminobenzoate, 2-ethylhexyl p-dimethylaminobenzoate, methyl p-dimethylaminobenzoate, 2-dimethylaminoethyl benzoate and butoxyethyl p-dimethylaminobenzoate.

The photopolymerizable composition may be transparent without including a colorant, and may include a colorant when necessary. When the photopolymerizable composition is desired to be colorless or white, materials having less color are preferably used besides the polymerization initiator, the polymerization accelerator and the colorant.

Known inorganic pigments and organic pigments can be used as a colorant coloring the photopolymerizable composition.

Specific examples of black pigments include, but are not limited to, carbon black produced by a furnace method of a channel method.

Specific examples of yellow pigments include, but are not limited to, pigments of Pigment Yellow series, such as Pigment Yellow 1, Pigment Yellow 2, Pigment Yellow 3, Pigment Yellow 12, Pigment Yellow 13, Pigment Yellow 14, Pigment Yellow 16, Pigment Yellow 17, Pigment Yellow 73, Pigment Yellow 74, Pigment Yellow 75, Pigment Yellow 83, Pigment Yellow 93, Pigment Yellow 95, Pigment Yellow 97, Pigment Yellow 98, Pigment Yellow 114, Pigment Yellow 120, Pigment Yellow 128, Pigment Yellow 129, Pigment Yellow 138, Pigment Yellow 150, Pigment Yellow 151, Pigment Yellow 154, Pigment Yellow 155, and Pigment Yellow 180.

Specific examples of magenta pigments include, but are not limited to, pigments of Pigment Red series, such as Pigment Red 5, Pigment Red 7, Pigment Red 12, Pigment Red 48(Ca), Pigment Red 48(Mn), Pigment Red 57(Ca), Pigment Red 57:1, Pigment Red 112, Pigment Red 122, Pigment Red 123, Pigment Red 168, Pigment Red 184, Pigment Red 202, and Pigment Violet 19.

Specific examples of cyan pigments include, but are not limited to, pigments of Pigment Blue series, such as Pigment Blue 1, Pigment Blue 2, Pigment Blue 3, Pigment Blue 15, Pigment Blue 15:3, Pigment Blue 15:4, Pigment Blue 16, Pigment Blue 22, Pigment Blue 60, Vat Blue 4, and Vat Blue 60.

Specific examples of white pigments include, but are not limited to, sulfuric acid salts of alkaline earth metals such as barium sulfate; carbonic acid salts of alkaline earth metals such as calcium carbonate; silica such as fine silicic acid powder and synthetic silicic acid salts; calcium silicate; alumina; alumina hydrate; titanium oxide; zinc oxide; talc; and clay.

In addition, various inorganic or organic pigments may be optionally used considering, for example, physical properties of the photopolymerizable composition.

Further, in the photopolymerizable composition, a polymerization inhibitor (e.g., 4-methoxy-1-naphthol, methylhydroquinone, hydroquinone, t-butylhydroquinone, di-t-butylhydroquinone, methoquinone, 2,2'-dihydroxy-3,3'-di($\alpha$-methylcyclohexyl)-5,5'-dimethyldiphenylmethane, p-benzoquinone, di-t-butyl diphenylamine, and 9,10-di-n-butoxyanthracene, 4,4'-[1,10-dioxo-1,10-decandiylbis(oxy)]bis[2,2,6,6-tetramethyl]-1-piperidinyloxy), a surfactant (e.g., higher fatty acid ester containing polyether, an amino group, a carboxyl group, or a hydroxyl group, a polydimethylsiloxane compound containing, in its side chain or terminal, polyether, an amino group, a carboxyl group, or a hydroxyl group, and a fluoroalkyl compound containing a polyether residue, an amino group, a carboxyl group, and a hydroxyl group), and a polar group-containing polymer pigment dispersing agent may be optionally used.

The ink of the present invention can be housed in a container, and used as an ink cartridge. With this form, users do not have to directly touch the ink during operations, such as exchange of the ink, and thus there is no concern about staining of their fingers, hands, clothes, etc. In addition, it is possible to prevent interfusion of foreign matter such as dust into the ink.

The container is not particularly limited, and a shape, structure, size, and material thereof can be appropriately selected depending on the intended purpose. As for the container, for example, preferred is a container having an ink bag formed of an aluminum laminate film, or a resin film.

Figure 2:
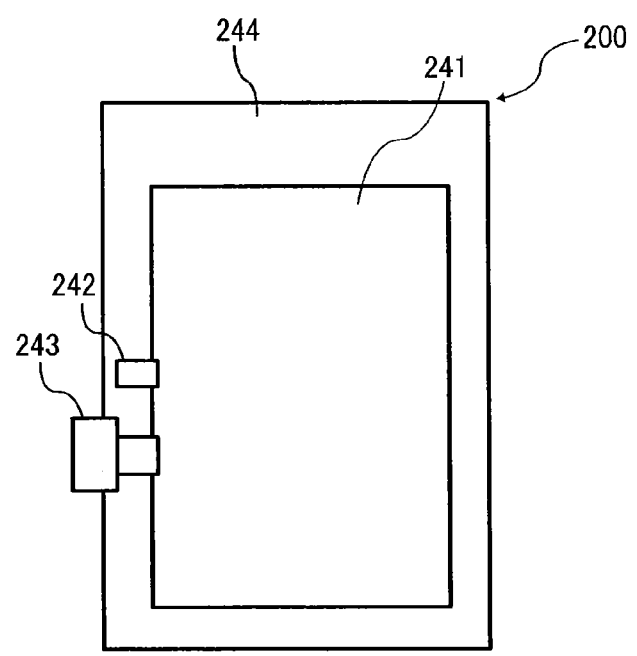
FIG. 2 is a schematic view illustrating an example of the ink cartridge of the present invention housing the ink bag.

The ink cartridge will be explained with reference to FIGS. 1 and 2. FIG. 1 is a schematic diagram illustrating one example of an ink bag 241 of the ink cartridge, and FIG. 2 is a schematic diagram illustrating the ink cartridge 200, in which the ink bag 241 of FIG. 1 is housed in a cartridge case 244.

As illustrated in FIG. 1, the ink bag 241 is filled with the ink by injecting the ink from an ink inlet 242. After removal of air present inside the ink bag 241, the ink inlet 242 is sealed by fusion bonding. At the time of use, a needle attached to the main body of the device is inserted into an ink outlet 243 formed of a rubber member to supply the ink to the device therethrough. The ink bag 241 is formed of a wrapping member such as an air non-permeable aluminum laminate film. As illustrated in FIG. 2, the ink bag 241 is typically housed in a plastic cartridge case 244, which is then detachably mounted in various inkjet recording devices to thereby use as the ink cartridge 200.

The ink cartridge of the present invention is preferably detachably mounted in inkjet recording devices. The ink cartridge can simplify the refill and exchange of the ink to improve workability.

As for a coating base for the ink of the present invention, paper, plastic, metal, ceramic, glass, or a composite material thereof is used. Since an absorbent base, such as wood free paper, can expect an effect of penetrating and drying, it is practical to use an aqueous ink or an oil ink, which is not a quick-drying ink, for such base. On the other hand, it is practical to use a quick-drying ink for a non-absorbent base, such as gloss coat paper, a plastic film, a plastic molded article, ceramic, glass, and metal.

The ink of the present invention is preferably used on, but is not limited to, the non-absorbent base of being immediately cured upon application of light. Among the non-absorbent bases, the ink of the present invention is suitably used for a plastic material, such as a plastic film, and a plastic molded article, which is formed of polyethylene, polypropylene, polyethylene terephthalate, polycarbonate, an ABS resin, polyvinyl chloride, polystyrene, any of other polyesters, polyamide, a vinyl-based material, or a composite material thereof.

EXAMPLES

Having generally described this invention, further understanding can be obtained by reference to certain specific examples which are provided herein for the purpose of illustration only and are not intended to be limiting. In the descriptions in the following examples, the numbers represent weight ratios in parts, unless otherwise specified.

<Evaluation Method of SI Value>

According to the skin sensitization test based on the LLNA (Local Lymph Node Assay), the SI value was measured in the manner described below.

[Test Material]

<<Positive Control>>

α-hexylcinnamaldehyde (HCA; product of Wako Pure Chemical Industries, Ltd.) was used as the positive control.

<<Medium>>

As a medium, a mixture containing acetone (product of Wako Pure Chemical Industries, Ltd.) and olive oil (product of Fudimi Pharmaceutical Co., Ltd.) in a volume ratio of 4/1 was used.

<<Animals Used>>

Before treated with the test substances, the positive control or the medium control, female mice were acclimated for 8 days including 6-day quarantine. No abnormalities were found in all the mice (used animals) during the quarantine/acclimation period.

Based on the body weights measured 2 days before the initiation of sensitization, they were categorized into 2 groups (4 mice/group) by the body weight stratified random sampling method so that the body weight of each individual was within ±20% of the average body weight of all the individuals. Each of the used animals was 8 weeks old to 9 weeks old at the time of the initiation of sensitization. The individuals remaining after the categorization were excluded from the test.

The used animals were individually identified by application of oil ink to their tale throughout the test period, and also their cages were labeled for identification.

<<Housing Environment>>

Throughout the housing period including the quarantine/acclimation period, the used animals were housed in an animal room with barrier system, which was set as follows: 21° C. to 25° C. in temperature, 40% to 70% in relative humidity, 10 times/hour to 15 times/hour in frequency of air circulation, and a 12 hour-interval lighting cycle (lighting from 7:00 to 19:00).

The housing cages used were those made of polycarbonate, and four animals were housed in each cage.

The used animals were given ad libitum solid feed for laboratory animals MF (product of Oriental Yeast Co., Ltd.). Also, using a water-supply bottle, the used animals were given ad libitum tap water in which sodium hypochlorite (PURELOX, product of OYALOX Co., Ltd.) had been added so that the chlorine concentration was about 5 ppm. Bedding used was SUNFLAKE (fir tree, shavings obtained with a power planer) (product of Charles River Inc.). The feed and all of the feeding equipments were sterilized with an autoclave (121° C., 30 min) before use.

The housing cage and the bedding were replaced with new ones at the times of the categorization and the removal of the auricular lymph node (i.e., the time when the animals were transferred from the animal room), and the water-supply bottle and rack were replaced with new ones at the time of the categorization.

[Test Method]

<<Group Composition>>

The group compositions of the medium control group and positive control group used for the measurement of the Si value are shown in Table 1.

TABLE 1

| Test group | Sensitization substance | Sensitization dose (μL/auricle) | Times of sensitization | Number of animals (animal No.) |
|---|---|---|---|---|
| Medium control group | Medium only | 25 | Once/day × 3 days | 4 (1-4) |
| Positive control group | 25.0% HCA | 25 | Once/day × 3 days | 4 (5-8) |

[Preparation]

<<Test Substance>>

Table 2 shows the amount of the test substance. The test substance was weighed in a measuring flask, and the volume of the test substance was adjusted to 1 mL with the medium. The thus-prepared test substance preparation was placed in a light-shielded airtight container (made of glass).

TABLE 2

| | Concentration after adjustment (w/v %) | Mass of test substance (g) |
|---|---|---|
| Test substance | 50.0 | 0.5 |

<<Positive Control Substance>>

About 0.25 g of HCA was accurately weighed, and the medium was added to the HCA to have the volume of 1 mL, to thereby prepare a 25.0% by mass solution. The thus-prepared positive control substance preparation was placed in a light-shielded airtight container (made of glass).

<<BrdU>>

In a measuring flask, 200 mg of 5-bromo-2'-deoxyuridine (BrdU, product of NACALAI TESQUE, INC.) was accurately weighed in a measuring flask. Then, physiological saline (product of OTSUKA PHARMACEUTICAL CO., LTD.) was added to the measuring flask, and dissolved through application of ultrasonic waves. Thereafter, the volume of the resultant solution was adjusted to 20 mL to prepare a 10 mg/mL solution (BrdU preparation). The BrdU preparation was sterilized through filtration with a sterilized filtration filter and placed in a sterilized container.

<<Preparation Day and Storage Period>>

The positive control preparation was prepared on the day before the initiation of sensitization, and stored in a cold place except in use. The medium and the test substance preparations were prepared on the day of sensitization. The BrdU preparation was prepared 2 days before administration and stored in a cold place until the day of administration.

[Sensitization and Administration of BrdU]

<<Sensitization>>

Each (25 μL) of the test substance preparations, the positive control preparation or the medium was applied to both the auricles of each of the used animals using a micropipetter. This treatment was performed once a day for three consecutive days.

<<Administration of BrdU>>

About 48 hours after the final sensitization, the BrdU preparation (0.5 mL) was intraperitoneally administered once to each of the used animals.

[Observation and Examination]

<<General Conditions>>

All the used animals used for the test were observed once or more times a day from the day of the initiation of sensitization to the day of the removal of the auricular lymph node (i.e., the day when the animals were transferred from the animal room). Notably, the observation day was counted from the day of the initiation of sensitization being regarded as Day 1.

<<Measurement of Body Weights>>

The body weight of each of the used animals was measured on the day of the initiation of sensitization and on the day of the removal of the auricular lymph node (i.e., the day when the animals were transferred from the animal room). Also, the average of the body weights and the standard error thereof were calculated for each group.

<<Removal of Auricular Lymph Node and Measurement of Weight Thereof>>

About 24 hours after the administration of BrdU, the used animals were allowed to undergo euthanasia, and their auricular lymph nodes were sampled. The surrounding tissue of each auricular lymph node was removed, and the auricular lymph nodes from both the auricles were collectively weighed. Also, the average of the weights of the auricular lymph nodes and the standard error thereof were calculated for each group. After the measurement of the weights, the auricular lymph nodes of each individual were stored in a frozen state using a BIO MEDICAL FREEZER set to −20° C.

<<Measurement of BrdU Intake>>

After returning the auricular lymph nodes to room temperature, the auricular lymph nodes were mashed with the gradual addition of physiological saline, and suspended therein. The thus-obtained suspension was filtrated and then dispensed into the wells of a 96-well microplate, with 3 wells being used per individual. The thus-dispensed suspensions were measured for intake of BrdU by the ELISA method. The reagents used were those of a commercially available kit (Cell Proliferation ELISA, BrdU colorimetric, Cat. No. 1647229, product of Roche Diagnostics Inc.). A multiplate reader (FLUOSTAR OPTIMA, product of BMG LABTECH Inc.) was used to measure the absorbance of each well (OD: 370 nm to 492 nm, the intake of BrdU), and the average of the absorbance of the 3 wells for each individual was used as the measurement of BrdU for the individual.

[Evaluation of Results]

<<Calculation of Stimulation Index (SI)>>

As shown in the following formula, the measurement of BrdU intake for each individual was divided by the average of the measurements of BrdU intake in the vehicle control group to calculate the SI value for the individual. The SI value of each test group was the average of the SI values of the individuals. Also, the standard error of the SI values was calculated for each test group. Notably, the SI value was rounded at the second decimal place and shown to the first decimal place.

$$SI = \frac{\text{Average of measurements of BrdU intake for each individual (average of 3 wells)}}{\text{Average of measurements of BrdU intake in the vehicle control group (average of 4 animals)}}$$

Examples 1 to 20 and Comparative Examples 1 to 3

The following materials (a) and (b) were mixed at ratios (parts by weight) shown in Tables 3-1 to 3-6 to prepare inks of Examples and Comparative Examples.

(a) (Meth)acrylic acid ester having negative skin sensitization (b) Photoradical polymerization initiator Details of a1 to a8 and b1 are as follows. Values in ( ) at the ends are SI values in (1) LLNA test, and "None" means "negative for skin sensitization" or "no skin sensitization" in (2) MSDS (Material Safety Data Sheet).

a1: diethyleneglycoldimethacrylate (n=2) "2G" from Shin-Nakamura Chemical Co., Ltd., (1.1)

a2: caprolactone-modified dipentaerythritol hexaacrylate DPCA 60 from Nippon Kayaku Co., Ltd. (Negative in MSDS)

a3: ethyleneoxide-modified trimethylolpropanetrimethacrylate (n=3) "TMPT-3EO" from Shin-Nakamura Chemical Co., Ltd., (1.0)

a4: ethyleneoxide-modified bisphenol A diacrylate (n=10) "BPE-10" from DAI-ICHI KOGYO SEIYAKU CO., LTD., (1.2).

a5: polypropyleneglycol diacrylate (n=12) "M-270" from Toagosei Company Limited. (1.5)

a6: ethyleneoxide-modified pentaerythritol tetracrylate (n=35) "ATM35E" from Shin-Nakamura Chemical Co., Ltd., (1.6)

a7: polyethyleneglycoldimethacrylate (n=9) "9EG" from Kyoeisha Chemical Co. LTD. (1.3)

a8: polyethyleneglycoldimethacrylate (n=14) "14EG" from Kyoeisha Chemical Co. LTD. (1.6)

b1: 1-hydroxycyclohexylphenylketone "Irgacure 184" from BASF (Negative in MSDS)

The viscosity (mPa·s) and the strength of coating film at 25, 45 and 60° C. of each ink were measured.

The viscosity of each ink was measured by a cone plate-type rotary viscometer (manufactured by TOKI SANGYO CO., LTD.) with the temperature of circulating water being constantly set 25, 45 and 60° C. The temperature of 25° C. is temperature set considering typical room temperature. The temperatures of 45 and 60° C. are temperatures of a heatable marketed inkjet ejection head such as GEN4 from Ricoh Printing Systems, Ltd.

The photopolymerizable composition prepared at a predetermined combination was used as it was in evaluation by brush coating. To evaluate inkjet ink, after the ink was filtered through a membrane filter made of fluorine resin, having a pore diameter of 5 microns, the ink was sealed in an aluminum pouch bag having the shape in FIG. 1 so that a bubble was formed. The pouch bag the ink was sealed in was contained in a plastic cartridge as shown in FIG. 2. In a chassis capable of containing the cartridge, an ink flow channel was formed from the cartridge to the GEN4 head from Ricoh Printing Systems, Ltd. to eject the ink and form a solid coating film. Each of the brush coating and the inkjet printing was controlled to form a solid coating film having a thickness about 40 microns.

A solid coating film formed on a marketed polyethyleneterephthalate film (corona-treated E5100 having a thickness of 100 microns from Toyobo Co., Ltd.) was irradiated at 0.3 W/cm$^2$ and 1.2 J/cm$^2$ and hardened so as to evaluate its strength and processing suitability.

Scratch hardness of the irradiated and hardened coating film was evaluated by a pencil method specified in JIS-K-5600-5-4. Pencil hardness includes 2H, H, F, HB, B, 2B to 6B in descending order of hardness.

As for the processing suitability, the coating film was punched by a file punch LION PUNCH NO. 150 from LION OFFICE PRODUCTS CORP. to visually observe whether it is cracked or not.

Not cracked: good
Cracked: poor

TABLE 3

|   |   |   | Com. Ex. 1 | Ex. 1 | Ex. 2 | Ex. 3 |
|---|---|---|---|---|---|---|
| (a) |   | a1 | 95 | 85 | 80 | 65 |
|   |   | a2 | 5 | 5 | 5 | 5 |
|   |   | a3 |   |   |   |   |
|   |   | a4 |   |   |   |   |
|   |   | a5 |   |   |   |   |
|   |   | a6 |   |   |   |   |
|   |   | a7 |   |   |   |   |
|   |   | a8 |   |   |   |   |
| (b) |   | b1 | 20 | 20 | 20 | 20 |
|   | 25° C. viscosity |   | 7 | 12 | 12 | 35 |
|   | 45° C. viscosity |   | *1 | *1 | *1 | 14 |
|   | 60° C. viscosity |   | *1 | *1 | *1 | *1 |
| Inkjet Printing | Ejection head temperature |   | 25° C. | 25° C. | 25° C. | 45° C. |
|   | Coating film strength |   | F | HB | HB | F |
|   | Processing suitability |   | Poor | Good | Good | Good |
| Brush Coating | Coating film strength |   | F | HB | HB | F |
|   | Processing suitability |   | Poor | Good | Good | Good |

|   |   |   | Ex. 4 | Ex. 5 | Ex. 6 | Com. Ex. 2 |
|---|---|---|---|---|---|---|
| (a) |   | a1 | 45 | 25 | 50 | 50 |
|   |   | a2 | 5 | 5 | 5 |   |
|   |   | a3 |   |   |   | 50 |
|   |   | a4 |   |   | 45 |   |
|   |   | a5 | 50 | 70 |   |   |
|   |   | a6 |   |   |   |   |
|   |   | a7 |   |   |   |   |
|   |   | a8 |   |   |   |   |
| (b) |   | b1 | 20 | 20 | 20 | 20 |
|   | 25° C. viscosity |   | 30 | 35 | 40 | 16 |
|   | 45° C. viscosity |   | 11 | 16 | 19 | 8 |
|   | 60° C. viscosity |   | *1 | 9 | 9 | *1 |
| Inkjet Printing | Ejection head temperature |   | 45° C. | 60° C. | 60° C. | 45° C. |
|   | Coating film strength |   | F | HB | F | H |
|   | Processing suitability |   | Good | Good | Good | Poor |
| Brush Coating | Coating film strength |   | F | HB | F | H |
|   | Processing suitability |   | Good | Good | Good | Poor |

|   |   |   | Ex. 7 | Ex. 8 | Ex. 9 | Ex. 10 |
|---|---|---|---|---|---|---|
| (a) |   | a1 | 45 | 45 | 40 | 40 |
|   |   | a2 |   |   |   |   |
|   |   | a3 | 50 | 45 | 40 | 40 |
|   |   | a4 |   |   |   |   |
|   |   | a5 |   |   |   | 20 |
|   |   | a6 |   |   | 20 |   |
|   |   | a7 |   | 10 |   |   |
|   |   | a8 | 5 |   |   |   |

TABLE 3-continued

| (b) |   | b1 | 20 | 20 | 20 | 20 |
|---|---|---|---|---|---|---|
|   | 25° C. viscosity |   | 20 | 18 | 32 | 22 |
|   | 45° C. viscosity |   | 10 | 9 | 13 | 11 |
|   | 60° C. viscosity |   | *1 | *1 | *1 | *1 |
| Inkjet Printing | Ejection head temperature |   | 45° C. | 45° C. | 45° C. | 45° C. |
|   | Coating film strength |   | F | F | H | H |
|   | Processing suitability |   | Good | Good | Good | Good |
| Brush Coating | Coating film strength |   | F | F | H | H |
|   | Processing suitability |   | Good | Good | Good | Good |

|   |   |   | Ex. 11 | Com. Ex. 3 | Ex. 12 | Ex. 13 |
|---|---|---|---|---|---|---|
| (a) |   | a1 | 40 | 70 | 60 | 50 |
|   |   | a2 |   | 10 | 10 | 10 |
|   |   | a3 | 40 | 20 | 20 | 20 |
|   |   | a4 | 20 |   |   |   |
|   |   | a5 |   |   |   |   |
|   |   | a6 |   |   |   |   |
|   |   | a7 |   |   |   | 20 |
|   |   | a8 |   |   | 10 |   |
| (b) |   | b1 | 20 | 15 | 15 | 15 |
|   | 25° C. viscosity |   | 33 | 14 | 18 | 22 |
|   | 45° C. viscosity |   | 14 | 8 | 10 | 14 |
|   | 60° C. viscosity |   | *1 | *1 | *1 | *1 |
| Inkjet Printing | Ejection head temperature |   | 45° C. | 45° C. | 45° C. | 45° C. |
|   | Coating film strength |   | H | H | HB | HB |
|   | Processing suitability |   | Good | Poor | Good | Good |
| Brush Coating | Coating film strength |   | H | H | HB | HB |
|   | Processing suitability |   | Good | Poor | Good | Good |

|   |   |   | Ex. 14 | Ex. 15 | Ex. 16 | Ex. 17 |
|---|---|---|---|---|---|---|
| (a) |   | a1 | 55 | 50 | 50 | 50 |
|   |   | a2 | 10 | 10 | 10 |   |
|   |   | a3 | 20 | 20 | 20 |   |
|   |   | a4 |   |   | 20 |   |
|   |   | a5 |   | 20 |   |   |
|   |   | a6 | 15 |   |   | 50 |
|   |   | a7 |   |   |   |   |
|   |   | a8 |   |   |   |   |
| (b) |   | b1 | 15 | 15 | 15 | 15 |
|   | 25° C. viscosity |   | 30 | 31 | 40 | 51 |
|   | 45° C. viscosity |   | 13 | 14 | 16 | 18 |
|   | 60° C. viscosity |   | *1 | *1 | 9 | 11 |
| Inkjet Printing | Ejection head temperature |   | 45° C. | 45° C. | 60° C. | 60° C. |
|   | Coating film strength |   | H | H | H | F |
|   | Processing suitability |   | Good | Good | Good | Good |
| Brush Coating | Coating film strength |   | H | H | H | F |
|   | Processing suitability |   | Good | Good | Good | Good |

|   |   |   | Ex. 18 | Ex. 19 |
|---|---|---|---|---|
| (a) |   | a1 | 30 | 50 |
|   |   | a2 |   |   |
|   |   | a3 |   |   |
|   |   | a4 |   | 50 |
|   |   | a5 | 70 |   |
|   |   | a6 |   |   |
|   |   | a7 |   |   |
|   |   | a8 |   |   |
| (b) |   | b1 | 15 | 15 |
|   | 25° C. viscosity |   | 31 | 55 |
|   | 45° C. viscosity |   | 13 | 19 |
|   | 60° C. viscosity |   | *1 | 12 |
| Inkjet |   | Ejection head | 45° C. | 60° C. |

TABLE 3-continued

| | | | |
|---|---|---|---|
| Printing | temperature | | |
| | Coating film strength | HB | F |
| | Processing suitability | Good | Good |
| Brush Coating | Coating film strength | HB | F |
| | Processing suitability | Good | Good |

*1: Viscosity was not measured because the ink was ejectable at lower temperature.

When diethyleneglycoldimethacrylate or ethyleneoxide-modified trimethylol propane trimethacrylate having an average polymerization degree of an alkoxy part n of 2 or 3 is used, the processing suitability is insufficient. Alkoxy-modified (meth)acrylic acid ester having an n not less than 9 prevents the coating film from cracking when processed.

When Comparative Example 1 is compared with Examples 3 to 6, Comparative Example 2 with Examples 9 to 11, and Comparative Example 3 with Examples 12 to 16, a suitable amount of ethyleneoxide-modified bisphenol A diacrylate (n=10), polypropyleneglycol diacrylate (n=12) or ethyleneoxide-modified pentaerythritol tetracrylate (n=35) as the alkoxy-modified (meth)acrylic acid ester having an n not less than 9 improves the processing suitability without deteriorating strength of the coating film.

Ethyleneoxide-modified trimethylol propane trimethacrylate has a formula $[CH_3CH_2C-\{CH_2(O-CH_2CH_2)_x-OCOC(CH_3)=CH_2\}_3]$. X represents a length of ethyleneoxide part. The larger the X, the larger the molecular weight and the higher the viscosity. The higher the viscosity, the more difficult to use as an inkjet ink material. However, monomers of a4 to a8 are expected to improve processing suitability. It is preferable not to use trimethylol propane trimethacrylate (x=0) because of having a symbol mark "N" representing environmental dangerous hazardousness and a risk phrase "R51/53" representing acute aquatic toxicity and long-term adverse affect in EU. Directive 67/548/EEC in consideration of influence on the environment. X of the ethyleneoxide-modified trimethylol propane trimethacrylate used in Examples is 1. The ethyleneoxide-modified trimethylol propane trimethacrylate does not have a problem of viscosity as a material included in an inkjet ink. The photopolymerizable composition including this forms a coating film having sufficient strength. Further, the ethyleneoxide-modified trimethylol propane trimethacrylate has no problem of skin sensitization, environmental dangerous hazardousness, acute aquatic toxicity and long-term adverse affect. X may be larger when necessary.

There were no noticeable differences between coating films formed by the inkjet printing and the brush coating. All the photopolymerizable compositions and the inks had no particular odors to be cautioned.

Having now fully described the invention, it will be apparent to one of ordinary skill in the art that many changes and modifications can be made thereto without departing from the spirit and scope of the invention as set forth therein.

What is claimed is:

1. A photopolymerizable composition, comprising:
diethyleneglycoldimethacrylate; and
alkoxy-modified acrylic acid ester having an n not less than 9,
wherein the n is an average polymerization degree of an alkoxy part of the (meth)acrylic acid ester.

2. The photopolymerizable composition of claim 1, wherein the alkoxy-modified acrylic acid ester is ethyleneoxide-modified bisphenol A diacrylate and the n is 10.

3. The photopolymerizable composition of claim 1, wherein the alkoxy-modified acrylic acid ester is polypropyleneglycol diacrylate and the n is 12.

4. The photopolymerizable composition of claim 1, wherein the alkoxy-modified acrylic acid ester is ethyleneoxide-modified pentaerythritol tetraacrylate and the n is 35.

5. The photopolymerizable composition of claim 1, further comprising caprolactone-modified dipentaerythritol hexaacrylate.

6. The photopolymerizable composition of claim 1, further comprising ethyleneoxide-modified trimethylolpropane trimethacrylate.

7. An inkjet ink, comprising the photopolymerizable composition according to claim 1.

8. A cartridge containing the ink according to claim 7.

9. A coated matter coated with the photopolymerizable composition according to claim 1.

* * * * *